United States Patent
Kempen et al.

(10) Patent No.: US 9,119,280 B2
(45) Date of Patent: Aug. 25, 2015

(54) RADIATION SOURCE

(75) Inventors: Antonius Theodorus Wilhelmus Kempen, 's-Hertogenbosch (NL); Erik Roelof Loopstra, Eindhoven (NL); Christian Wagner, Duizel (NL); Henricus Gerardus Tegenbosch, Eindhoven (NL); Gerardus Hubertus Petrus Maria Swinkels, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 14/234,982

(22) PCT Filed: Dec. 13, 2011

(86) PCT No.: PCT/EP2011/072633
§ 371 (c)(1),
(2), (4) Date: Jan. 24, 2014

(87) PCT Pub. No.: WO2013/023710
PCT Pub. Date: Feb. 21, 2013

(65) Prior Publication Data
US 2014/0160453 A1    Jun. 12, 2014

Related U.S. Application Data

(60) Provisional application No. 61/522,928, filed on Aug. 12, 2011.

(51) Int. Cl.
*G21K 5/00* (2006.01)
*H05G 2/00* (2006.01)
*G03F 7/20* (2006.01)

(52) U.S. Cl.
CPC ............ *H05G 2/006* (2013.01); *G03F 7/70033* (2013.01); *H05G 2/003* (2013.01); *H05G 2/008* (2013.01)

(58) Field of Classification Search
USPC .................................. 250/493.1, 494.1, 504 R
See application file for complete search history.

(56) References Cited

U.S. PATENT DOCUMENTS

| 4,953,191 A | 8/1990 | Smither et al. |
| 8,138,487 B2 | 3/2012 | Vaschenko et al. |

(Continued)

FOREIGN PATENT DOCUMENTS

| DE | 101 47 454 | 4/2003 |
| DE | 103 57 412 | 7/2005 |

(Continued)

OTHER PUBLICATIONS

International Search Report and Written Opinion mailed May 7, 2012 in corresponding International Patent Application No. PCT/EP2011/072633.

*Primary Examiner* — Nicole Ippolito
(74) *Attorney, Agent, or Firm* — Pillsbury Winthrop Shaw Pittman LLP

(57) ABSTRACT

A radiation source includes a nozzle configured to direct a stream of fuel droplets along a trajectory towards a plasma formation location; a laser configured to output laser radiation, the laser radiation directed at the fuel droplets at the plasma formation location to generate, in use, a radiation generating plasma; and a catch configured to catch fuel droplets that pass the plasma formation location. The catch includes a container configured to contain a fluid; a driver configured to drive the fluid, to cause the fluid to move; the catch being configured such that the fuel droplets are incident on that moving fluid.

15 Claims, 6 Drawing Sheets

(56) References Cited

U.S. PATENT DOCUMENTS

| | | |
|---|---|---|
| 2007/0170377 A1 | 7/2007 | Nakano |
| 2009/0224181 A1 | 9/2009 | Abe et al. |
| 2010/0200776 A1 | 8/2010 | Yabu et al. |
| 2010/0258748 A1* | 10/2010 | Vaschenko et al. ....... 250/504 R |
| 2011/0248191 A1 | 10/2011 | Fomenkov et al. |

FOREIGN PATENT DOCUMENTS

| | | |
|---|---|---|
| EP | 1 775 755 | 4/2007 |
| JP | 2006-156577 | 6/2006 |
| JP | 2008-226462 | 9/2008 |
| WO | 2010/112048 | 10/2010 |
| WO | 2010/117858 | 10/2010 |

* cited by examiner

RADIATION SOURCE

CROSS-REFERENCE TO RELATED APPLICATIONS

This application is the U.S. national phase entry of International Patent Application No. PCT/EP2011/072633, filed Dec. 13, 2011, which claims the benefit of U.S. provisional application 61/522,928, which was filed on Aug. 12, 2011, both of which are incorporated herein in their entireties by reference.

FIELD

The present invention relates to a radiation source, suitable for use in conjunction with, or forming part of, a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles (i.e. droplets) of a suitable fuel material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source. In an alternative system, which may also employ the use of a laser, radiation may be generated by a plasma formed by the use of an electrical discharge—a discharge produced plasma (DPP) source.

A proposed LPP radiation source generates a continuous stream of fuel droplets. As discussed above, a laser beam may be directed at these fuel droplets to generate a radiation generating plasma. However, all droplets in that stream may not be targeted by the laser beam, and thus some droplets may pass through and beyond a plasma formation location without being, for example, vaporised or the like by the laser beam. These fuel droplets need to be caught, and preferably caught in such a way that minimises or avoids splashing, which splashing could contaminate the radiation source (e.g. a collector forming part of the radiation source).

A proposed apparatus for catching fuel droplets involves the use of an open-ended tube, as for example shown in published international (PCT) patent application WO 2010/117858. The droplets are directed into this tube such that the droplets are incident at a grazing incidence angle on an internal surface of the tube, thus causing little or no back-splashing. However, the required or desired dimensions of the tube are linked to the speed of the droplets and also the accuracy of delivery of the droplets into the tube. If the droplets are faster, then the angle of incidence needs to be more grazing, and the tube needs to, in general, increase in length. Alternatively or additionally, if the accuracy of droplet delivery is not consistent, then the tube opening may need to be wider, in order to be able to catch each and every droplet and at the required grazing angle of incidence. One or both of these problems can lead to the need for a larger tube, in terms of the length and/or width of the tube. Space within a radiation source is at a premium, and it is not desirable in terms of space restrictions, design restrictions and cost to make the radiation source bigger simply to accommodate such a tube-based catching device.

SUMMARY

It is desirable to obviate or mitigate at least one problem of the prior art, whether identified herein or elsewhere, or to provide an alternative to existing apparatus or methods.

According to an aspect, there is provided a radiation source comprising: a nozzle configured to direct a stream of fuel droplets along a trajectory towards a plasma formation location; a laser configured to output laser radiation, the laser radiation directed at the fuel droplets at the plasma formation location to generate, in use, a radiation generating plasma; and a catch arranged to catch fuel droplets that pass the plasma formation location, the catch comprising: a container constructed to contain a fluid; a driver constructed and arranged to drive the fluid, to cause the fluid to move; the catch being configured such that the fuel droplets are incident on that moving fluid.

The catch may further comprise a surface, the driver being arranged to drive fluid along, over or past the surface (which includes an underside of that surface), the catch being arranged such that, in use, the fuel droplets are incident on fluid that is driven along, over or past that surface.

Fluid that is driven along, over or past the surface may be inclined with respect to the trajectory of the droplets (e.g. be perpendicular to, or at angle between (but not including) 0 and 180 degrees to the droplet trajectory).

The surface may be inclined relative to the trajectory of the droplets, and the driver may be configured to at least assist in driving fluid down and along (which includes an underside of) the surface to form a film of fluid on that surface, the catch being arranged such that, in use, the fuel droplets are incident on the film of fluid.

The surface and driver may be arranged to ensure that fluid flows generally away from a trajectory of the droplets.

The driver may be configured to drive fluid over the surface to form a wave of fluid, the catch being arranged such that, in use, the fuel droplets are incident on the wave of fluid.

The driver might comprise a pump. The pump may pump fluid through one or more conduits to move the fluid in the described manner.

The container may be substantially tube-shaped with an opening arranged to receive the droplets.

The driver may be a rotating mechanism constructed to rotate the tube-shaped container.

The rotating mechanism may be constructed to rotate the tube fast enough to ensure that fluid resides on, and/or passes over, an internal surface of the tube-shaped container, the catch being arranged such that, in use, the fuel droplets are incident on fluid that resides on and/or passes over the internal surface of the tube-shaped container.

The nozzle may be configured to direct the stream of fuel droplets along a trajectory that is substantially horizontal, or which is substantially vertical, or in a trajectory that has a horizontal component, or in a trajectory that has a vertical component.

The fluid may be, or may comprise, the same material as that which forms the fuel droplets, or the fluid may be a carrier for the fuel.

The catch may comprise, or may be thermally connectable to, a heater. The heater may be configured to heat the fluid, and/or caught droplets, to maintain the fluid, and/or caught droplets, in a fluid form.

The catch may be in fluid connection with the nozzle, such that caught droplets may be directed to and back through the nozzle (e.g. so that the caught droplets may be recycled or reused).

The fluid may be a liquid (e.g. which includes a solid in an at least partially melted state).

The surface may be a wall or the like of the radiation source. The surface may be configured (e.g. shaped or textured) to direct fluid to the container.

According to a further aspect, there is provided a lithographic apparatus comprising: an illumination system constructed to provide a radiation beam; a patterning device for imparting the radiation beam with a pattern in its cross-section; a substrate holder constructed and arranged to hold a substrate; a projection system constructed and arranged to project the patterned radiation beam onto a target portion of the substrate, and wherein the lithographic apparatus further comprises, or is in connection with, the radiation source of the first aspect of the invention.

The surface may be a wall or the like of the lithographic apparatus or radiation source. The surface may be configured (e.g. shaped or textured) to direct fluid to the container.

According to yet another aspect, there is provided a method of catching fuel droplets used in a radiation source, the radiation source comprising: a nozzle configured to direct a stream of fuel droplets along a trajectory towards a plasma formation location; a laser configured to output laser radiation, the laser radiation directed at the fuel droplets at the plasma formation location to generate, in use, a radiation generating plasma; and the method comprising: driving a fluid to cause movement in that fluid; and directing the fuel droplets toward that moving fluid.

According to again yet another aspect, there is provided a catch arranged to catch fuel droplets that pass the plasma formation location, the catch comprising: a container constructed to contain a fluid; a driver constructed and arranged to drive the fluid, to cause the fluid to move; the catch being configured such that the fuel droplets are incident on that moving fluid. The catch may be used in conjunction with, or form a part of, a radiation source, for example a radiation source forming part of, or connectable to, a lithographic apparatus.

It will be appreciated that features described in relation to the first aspect may, where appropriate, be applicable to the second, third and/or fourth aspects.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
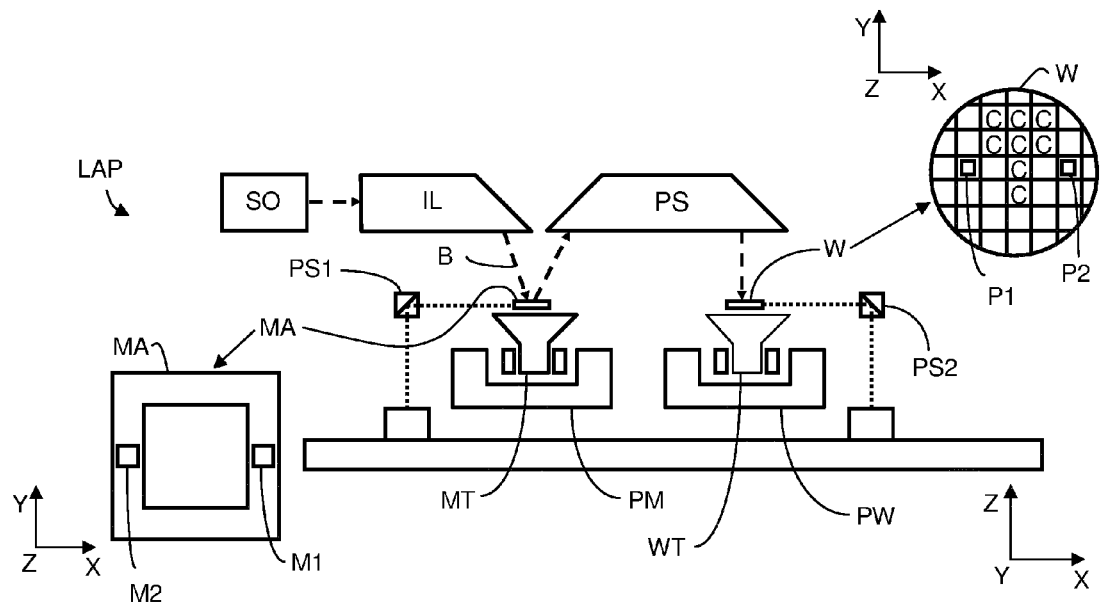
FIG. 1 depicts a lithographic apparatus according to an embodiment of the invention.

FIG. 1 schematically depicts a lithographic apparatus LAP including a source collector module SO according to an embodiment of the invention. The apparatus comprises: an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
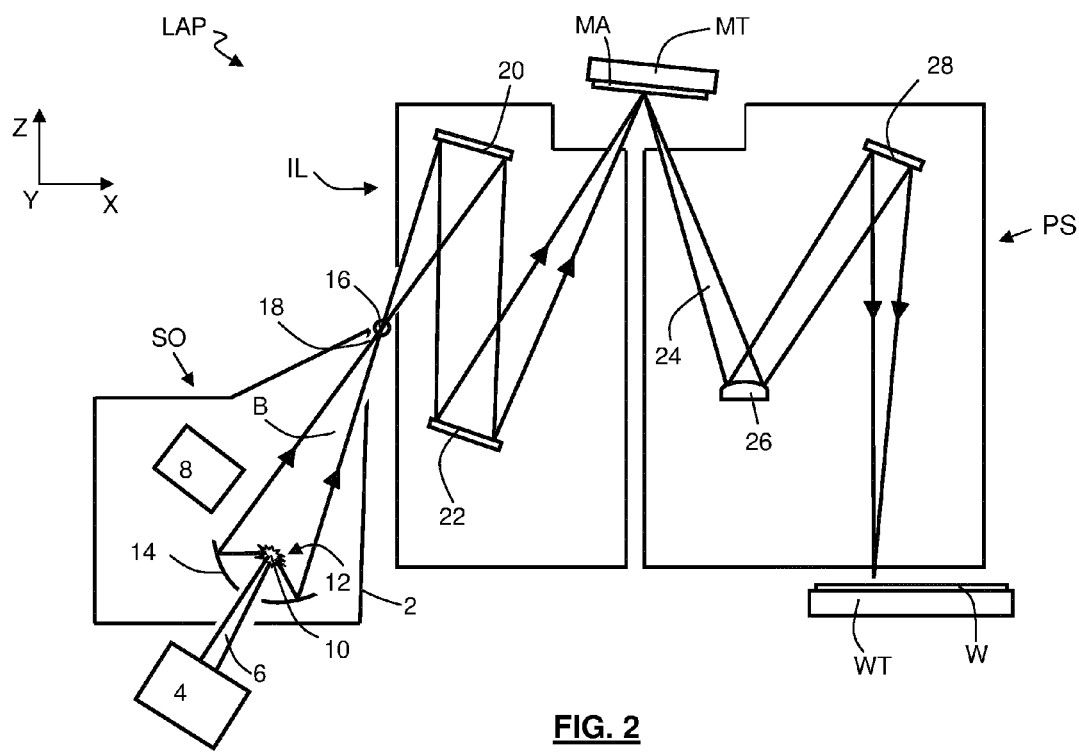
FIG. 2 is a more detailed view of the apparatus of FIG. 1, including an LPP source collector module, according to an embodiment of the invention.

FIG. 2 shows the lithographic apparatus LAP in more detail according to one embodiment, including the source collector module SO, the illumination system IL, and the projection system PS. The source collector module SO is constructed and arranged such that a vacuum environment can be maintained in an enclosing structure 2 of the source collector module.

A laser 4 is arranged to deposit laser energy via a laser beam 6 into a fuel, such as xenon (Xe), tin (Sn) or lithium (Li) which is provided from a fuel supply 8. This creates a highly ionized plasma 10 at a plasma formation location 12 which has electron temperatures of several tens of electronvolts (eV). The energetic radiation generated during de-excitation and recombination of these ions is emitted from the plasma 10, collected and focussed by a near normal incidence radiation collector 14. A laser 4 and a fuel supply 8 (and/or a collector 14) may together be considered to comprise a radiation source, specifically an EUV radiation source. The EUV radiation source may be referred to as a laser produced plasma (LPP) radiation source.

A second laser (not shown) may be provided, the second laser being configured to preheat the fuel before the laser beam 6 is incident upon it. An LPP source which uses this approach may be referred to as a dual laser pulsing (DLP) source.

Although not shown, the fuel supply might comprise, or be in connection with, a nozzle configured to direct a stream of fuel droplets along a trajectory towards the plasma formation location 12.

Radiation B that is reflected by the radiation collector 14 is focused at a virtual source point 16. The virtual source point 16 is commonly referred to as the intermediate focus, and the source collector module SO is arranged such that the intermediate focus 16 is located at or near to an opening 18 in the enclosing structure 2. The virtual source point 16 is an image of the radiation emitting plasma 10.

Subsequently, the radiation B traverses the illumination system IL, which may include a facetted field mirror device 20 and a facetted pupil mirror device 22 arranged to provide a desired angular distribution of the radiation beam B at the patterning device MA, as well as a desired uniformity of radiation intensity at the patterning device MA. Upon reflection of the beam of radiation at the patterning device MA, held by the support structure MT, a patterned beam 24 is formed and the patterned beam 24 is imaged by the projection system PS via reflective elements 26, 28 onto a substrate W held by the wafer stage or substrate table WT.

More elements than shown may generally be present in the illumination system IL and projection system PS. Furthermore, there may be more mirrors present than those shown in the figures, for example there may be 1-6 additional reflective elements present in the projection system PS than shown in FIG. 2.

Figure 3:
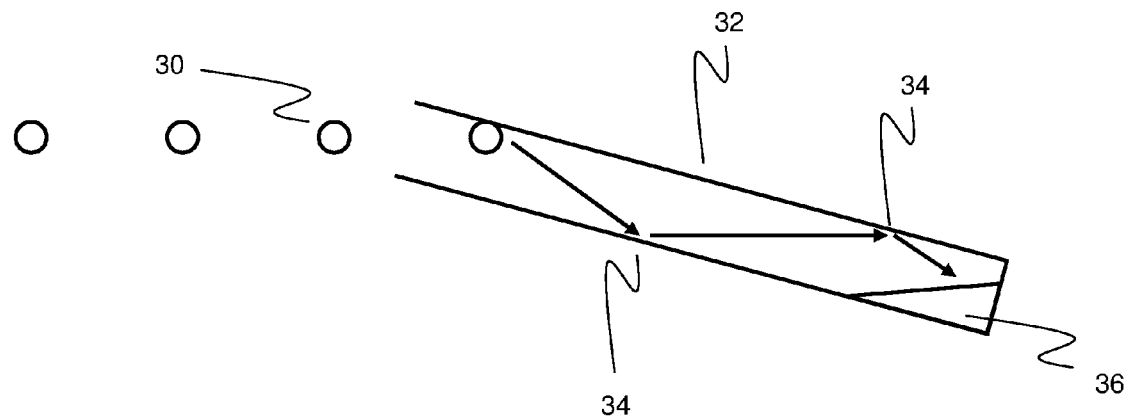
FIG. 3 schematically depicts a catch for catching fuel droplets that pass a plasma formation location in accordance with a proposed radiation source.

FIG. 3 schematically depicts a part of a proposed radiation source in more detail according to one embodiment. A stream of fuel droplets 30 is shown as having passed a plasma formation location (that location not being visible in this Figure). As a result of passing the plasma formation location, the droplets 30 need to be caught to prevent contamination of the radiation source. As already discussed above, in a proposed radiation source the droplets are caught by an open-ended tube-like container 32. The tube-like container 32 is configured (e.g., constructed, shaped, oriented or the like) to ensure that droplets 30 passing into the tube-like container 32 and incident on an internal surface of that container 32 are incident at substantially grazing angles of incidence 34. Such a configuration minimises the chances of the incident droplets 30 generating splash-back which could contaminate the radiation source (e.g. a collector forming part of the radiation source) or the lithographic apparatus as a whole. The fuel droplets 30 may create, and/or be finally incident upon a pool of fuel 36. A more detailed description of the arrangement shown in FIG. 4 may be found, for example, in published international (PCT) patent application WO 2010/117858.

It will be understood that the arrangement shown in FIG. 3 serves as a catch for catching fuel droplets that pass the plasma formation location. The catch may also be referred to as a droplet collector. While the catch shown in FIG. 3 may serve and function as intended, the design of the catch is such that design changes may be required if the fuel droplets 30 increase in speed, or the trajectory of the droplets 30 is not accurate. Such changes might be an increased length of the tube and an increased width of the opening of the tube, respectively. Both or either of these increases result in an increase in the space required to accommodate the catch, which may not be desirable when space is at a premium within and around a lithographic apparatus. Furthermore, droplet speed might need to be changed as and when required, but it may not be possible or easy to change the length of the tube accordingly. It is therefore desirable to provide a catch arranged to catch fuel droplets that pass the plasma formation location that is not subjected to the same design problems as shown in and described with reference to the catch of FIG. 3.

According to one embodiment of the present invention, one or more problems of existing and proposed catches arranged to catch fuel droplets that pass a plasma formation location of a radiation source may be obviated or mitigated. In one instance, on embodiment of the present invention provides a radiation source. The radiation source comprises a nozzle configured to direct a stream of fuel droplets along a trajectory towards a plasma formation location. A laser is also provided, which is configured to direct laser radiation at the fuel droplets at the plasma formation location to generate, in use, a radiation generating plasma. A catch is also provided to catch fuel droplets that pass the plasma formation location. Embodiments of the invention may be described as being distinguished from existing and proposed catches in that the catch comprises a container for containing a fluid (on to which the fuel droplets will be incident, in use). A driver is provided to drive the fluid to cause the fluid to move. The catch as a whole is configured (e.g., shaped, oriented, positioned or the like) such that the fuel droplets are incident on that moving fluid.

Although various different embodiments will be described, a common concept amongst those embodiments is that the fuel droplets are directed towards and onto or into a moving fluid. This is expected to reduce splash-back. Additional optional features, and associated benefits, will be discussed in more detail below.

Embodiments of the present invention will now be described, by way of example only, with reference to FIGS. 4 to 9, in which the same features have been given the same reference numerals for clarity and consistency. The Figures are schematic and have not been drawn to any particular scale.

Figure 4:
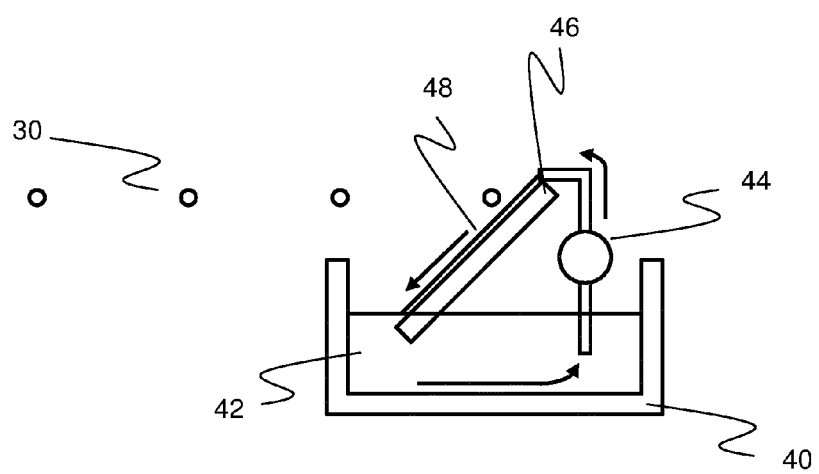
FIG. 4 schematically depicts a catch for catching droplets that pass a plasma formation location in accordance with an embodiment of the present invention.

FIG. 4 schematically depicts a catch for use in a radiation source, in accordance with an embodiment of the present invention. As with the arrangement of FIG. 3, a stream of fuel droplets 30 is shown as having a substantially horizontal trajectory, and the droplets 30 are incident on the catch with this substantially horizontal trajectory. The catch comprises a container 40 constructed to contain a fluid 42. The fluid 42 might be, or might comprise, the same material as that which forms the fuel droplets 30 (e.g. tin). Alternatively, the fluid 42 may be a carrier for the fuel droplets (e.g., a carrier from which the fuel could, at least in theory, be extracted using further processing or the like). In this embodiment the container 40 is substantially bath-like in form. The catch further comprises a driver 44 arranged to drive movement of the fluid 42 (e.g. at least movement of or across a surface of the fluid 42). In this embodiment the driver 44 comprises a pump. The pump 44 may be used in conjunction with one or more conduits or the like for directing flowing fluid.

When the stream of fuel droplets 30 has a substantially horizontal trajectory, a problem to be overcome is how to present the stream of fuel droplets 30 with a body of fluid for use in catching those droplets. In order to achieve this, the catch further comprises a surface 46. In general, the driver 44 is arranged to drive fluid along, over or past the surface 46. The catch is arranged such that, in use, the fuel droplets 30 are incident on fluid that is driven along, over or past that surface 46. Fluid 42 that is driven along, over or past the surface 46 is preferably inclined with respect to the trajectory of the droplets 30 (i.e., to present a body of fluid 42 into or onto which the droplets 30 may be directed). In this particular embodiment, the surface 46 is itself inclined relative to the trajectory of the droplets 30. The driver 44 is configured to at least assist in driving fluid 42 from the container 40 and then down and along the surface 46 to form a film of fluid 48 on that surface 46. The catch as a whole is then arranged (which includes located) such that, in use, the fuel droplets 30 are incident on that film of fluid 48. The use of the term "film" does not impose any particular limitation on the thickness or depth of the fluid on the surface 46. Instead, use of the term "film" is to at least suggest that, in use, the flow of fluid along the surface 46 is not generating any or a substantial amount of splashes or the like.

The catch of FIG. 4 may be considered as being beneficial for a number of reasons. At least one reason is that the catch provides a body of moving fluid into or onto which the fuel droplets may be directed, even though the fuel droplets are directed in a horizontal trajectory (as opposed to a vertical trajectory, with which the droplets could perhaps be caught with a simple stationary pool of fluid). Furthermore, the catch provides a moving body of fluid, which is thought to further promote the catching of the droplets while preventing or limiting splash-back. Further still, the fluid into or onto which the droplets are directed is non-perpendicular with respect to the trajectory of the droplets, which might also reduce splash-back.

Figure 5:
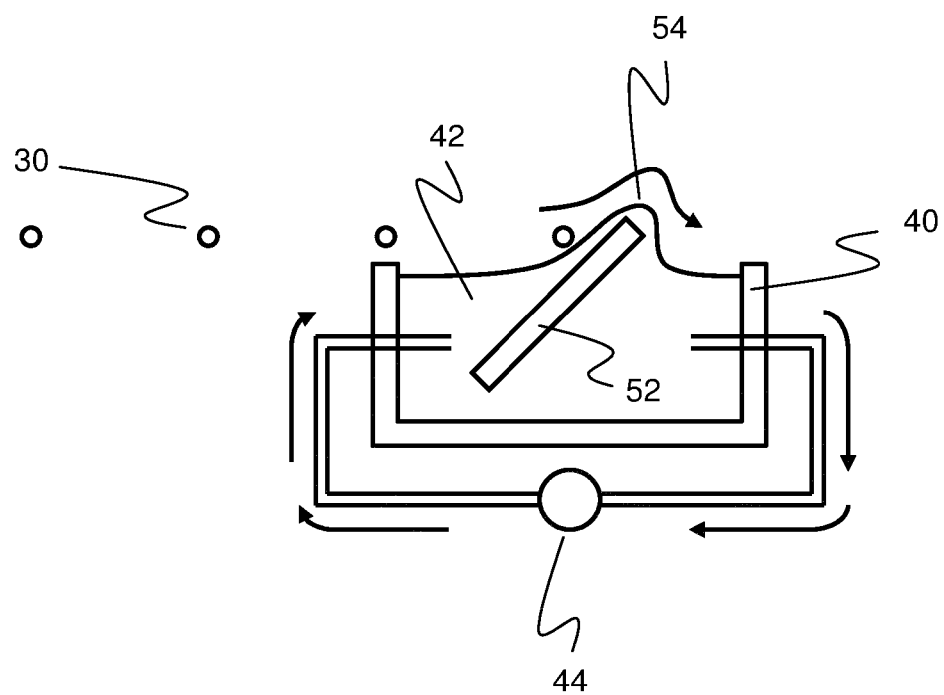
FIG. 5 schematically depicts a catch for catching droplets that pass a plasma formation location in accordance with an embodiment of the present invention.

FIG. 5 shows an alternative embodiment to that shown in FIG. 4. In FIG. 5 many of the same principles as shown in and described with reference to FIG. 4 still apply. However, and in contrast with FIG. 4, a driver 44 (which, again, might be or comprise a pump) is now configured to drive fluid 42 over a surface 52. The surface 52 might be inclined at a non-perpendicular direction relative to the direction of flow of fluid 42, to assist in the formation of a wave of fluid 54. The catch as a whole is then arranged such that, in use, the fuel droplets 30 are incident on the wave of fluid 54, to realise most, if not all, of the benefits already described in relation to the catch of FIG. 4.

Figure 6:
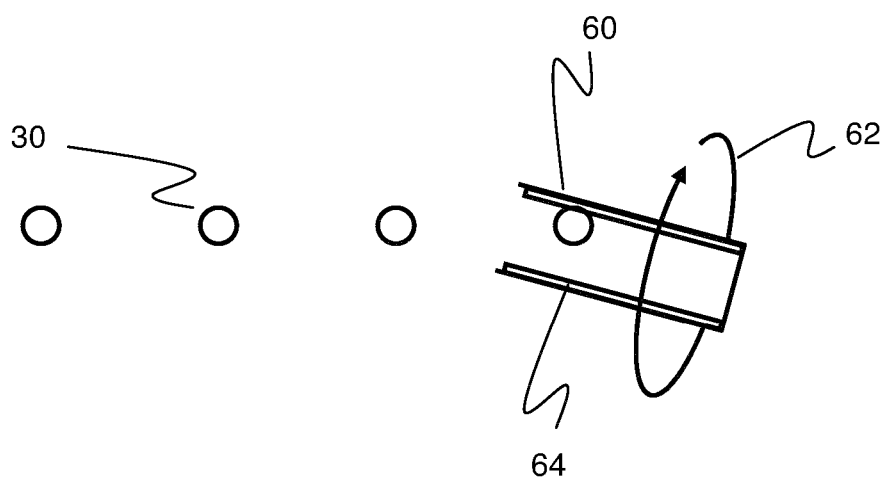
FIG. 6 schematically depicts a catch for catching droplets that pass a plasma formation location in accordance with an embodiment of the present invention.

FIG. 6 depicts a slightly different embodiment to that shown in and described with reference to FIGS. 4 and 5, and an embodiment which perhaps relates more closely to the existing or proposed catch shown in FIG. 3. Referring to FIG. 6, the catch now comprises a container that is substantially tube-shaped 60 with an opening arranged to receive the droplets 30. Distinguishing the catch from those that already exist or which are already proposed, is the provision of a driver which is or which comprises a rotating mechanism constructed to rotate 62 the tube-shaped container 60. The rotating mechanism is constructed to rotate the tube (i.e., in use) fast enough to ensure that fluid 54 (e.g. pre-loaded into the container 60) resides on, and/or passes over, an internal surface of the tube-shaped container.

Figure 7:
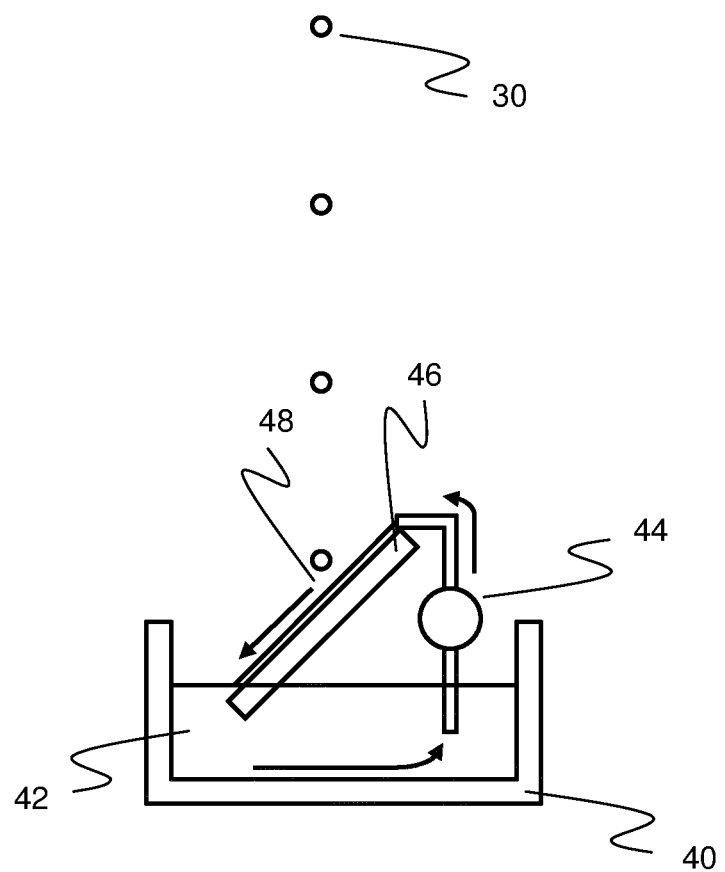
FIGS. 7 and 8 schematically depict subtle variations on the embodiments shown in and described with reference to FIGS. 4 and 5 respectively.
Figure 8:
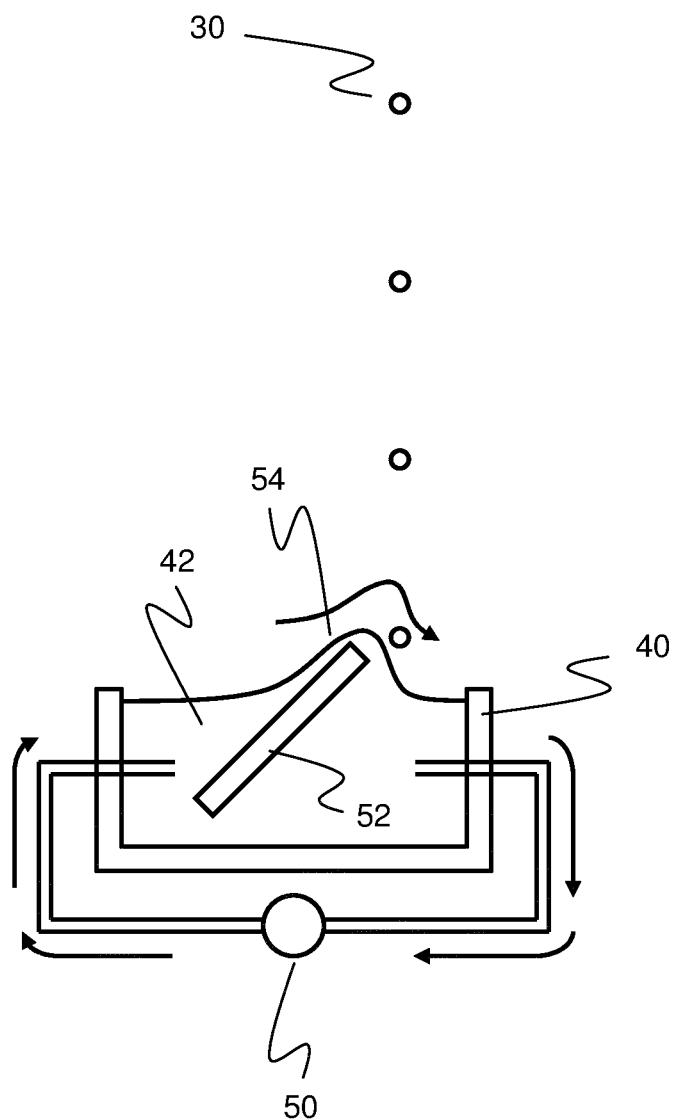

In rotating the tube 60 in the described manner, the benefits already shown in and described with reference to the embodiments of FIGS. 4 and 5 are also present and realised with the embodiment of FIG. 6. Specifically, the catch of FIG. 6 may be considered as being beneficial for a number of reasons. At least one reason is that the catch provides moving fluid into or onto which the fuel droplets may be directed, even if the fuel droplets are directed in a horizontal trajectory. Furthermore, the catch provides a moving body of fluid, which movement is thought to further promote the catching of the droplets while preventing or limiting splash-back. Further still, the fluid into or onto which the droplets are directed is non-perpendicular with respect to the trajectory of the droplets, which might also reduce splash-back In FIGS. 4 and 5, the trajectory of droplets has been shown as being substantially horizontal, or at least having a horizontal component, which would otherwise make it difficult to catch those droplets using a stationary pool of fluid having a substantially horizontal surface. However, the embodiments shown in FIGS. 4 and 5 are also applicable to situations where droplets have a substantially vertical trajectory (or at least a vertical component). Catches of FIGS. 7 and 8 are shown as corresponding with the catches shown in FIGS. 4 and 5 respectively. The Figures, however, now show that the droplets 30 have a substantially vertical trajectory. However, all of the benefits discussed above are equally applicable to the catches of FIGS. 7 and 8.

Various different catches according to embodiments of the present invention have been shown above. Although not shown, a simpler catch may also be provided for catching droplets having a substantially vertical trajectory, or at least a component in the vertical direction. A pool of fluid may be provided for catching these droplets. The invention may be distinguished by driving the fluid, to cause movement of the fluid (e.g. at least a surface thereof), the catch being configured such that the droplets of fuel are incident on that moving fluid. Moving the fluid may result in a reduction of splash-back, even in this relatively simple embodiment.

Although not shown in the Figures, embodiments of the present invention may additionally include a heater that forms part of the catch, or which is thermally connectable to the catch. 'Thermally connectable' may be defined functionally as the heater being able to heat fluid contained in the container of the catch. The heater may be configured to heat the fluid, and/or droplets caught in that fluid, to maintain the fluid and/or the caught droplet, in a fluid form. The heater may heat the fluid by any one of a number of means, for example, by conduction, convection or radiation.

In a related embodiment, or a development of an embodiment described above, the catch may be in fluid connection with a nozzle that is used to provide the stream of droplets (which includes a fuel reservoir for that nozzle). This allows caught droplets to be directed to and back through the nozzle, for example allowing for the recycling or reusing of the caught droplets. The caught droplets of fuel may need to be processed before being passed back to and through the nozzle, for example undergoing one or more filtration steps, or other forms of contamination removal.

In embodiments where the trajectory of the fuel droplets is substantially horizontal, or comprises a horizontal component, the described embodiments show a fluid that is inclined to the trajectory of the droplets. In an embodiment not shown or described above, the fluid may be driven so as to form a waterfall, for example flowing along and over or past a surface to generate a waterfall effect, or—perhaps more generally—a 'fluid-fall' effect. The catch may then be arranged such that the droplets are incident on and into that fluid-fall.

Figure 9:
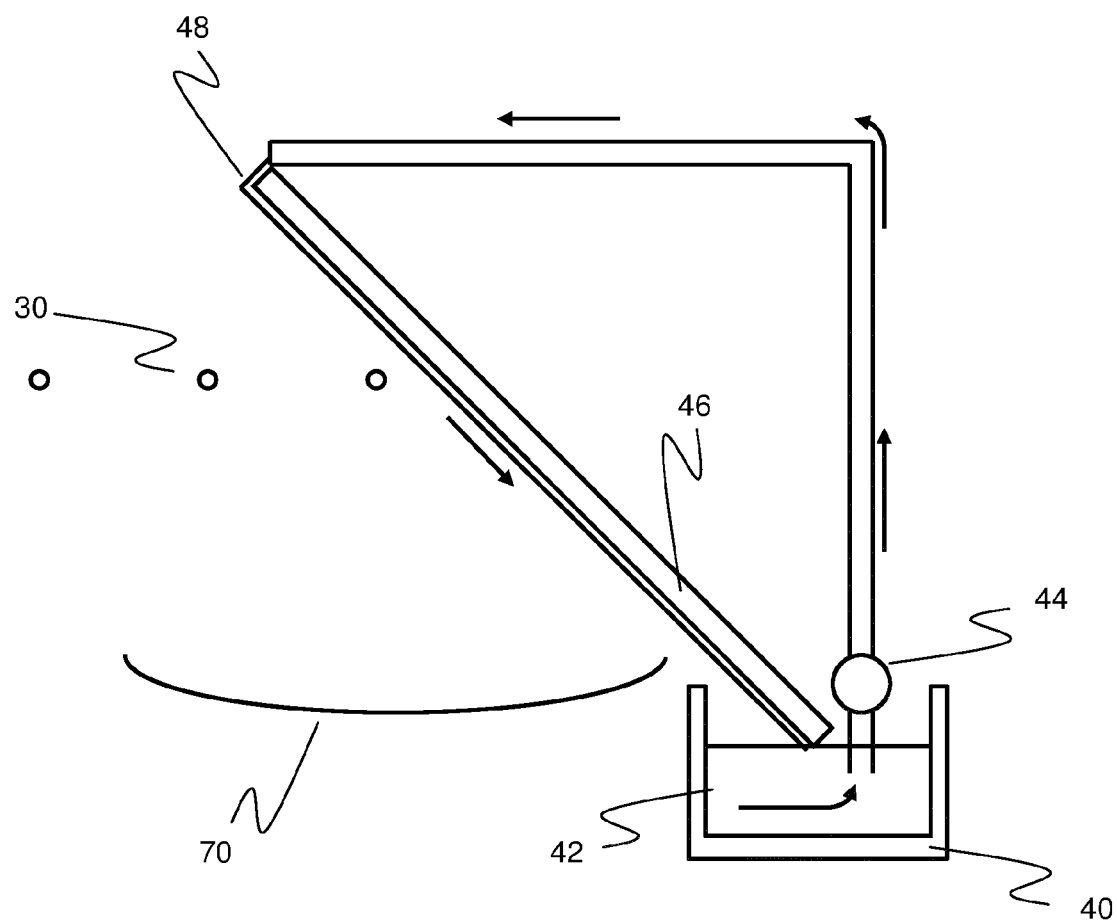
FIG. 9 schematically depicts a variation on the embodiment shown in FIG. 4.

Following on from the preceding paragraph, the fluid may be inclined to the trajectory of the droplets at an angle other than as shown in FIGS. 4 to 8. For example, FIG. 9 shows an embodiment related to that shown in and described with reference to FIG. 4 but in which, in contrast to the embodiment of FIG. 4, the fluid 48 is driven along an underside of the surface 46. This is achieved by flipping the orientation of the surface 46 (in comparison with its orientation in FIG. 4), so that the fluid 48 moves downwardly and away from the substantially horizontal trajectory of the droplets 30. The fluid 48 remains on the surface due to surface tension. The moving fluid 48 again prevents or limits splashing and the like of the droplets 30, for example preventing or limiting such splashing or the like on to a radiation collector surface 70 located below the fluid carrying surface 46. The fact that the fluid 48 now moves away from the substantially horizontal trajectory of the droplets 30 may reduce splashing, for example in comparison with if the fluid 48 moved toward the substantially horizontal trajectory of the droplets 30 (as is shown in FIG. 4).

As shown in FIG. 9, the entire surface over, along or past which fluid is driven does not need to be located over a container. Instead, only a portion may need to be located over the container, for example an end portion from which fluid may flow in to the container. Another portion may extend over or beyond an object to be protected from contamination, for example a collector of a radiation source.

The surface over, along or past which fluid is driven has been shown as a separate surface. In other embodiments, the surface could be a surface of a radiation source, or a surface of a lithographic apparatus (e.g. a wall thereof, or a wall of another structure of the source of apparatus). The surface may be configured to ensure that flowing fluid is directed in certain directions, for example to one or more containers.

The volume of fluid that may need to be located on the surface at any one time may depend on a number of factors, for example a desired depth of the fluid (e.g. film thickness), and the dimensions of the surface.

It will be appreciated that the radiation source described above, having the catch of any one of the embodiments described above, may be particularly beneficial as an isolated or independent apparatus, and may be manufactured, sold, shipped or the like as a radiation unit in isolation. However, it will also be appreciated that the radiation source may form part of other apparatus, for example a lithographic apparatus such as that shown above and described with reference to FIGS. 1 and 2. An embodiment of the present invention might also be described as a catch for use in a radiation source, the catch having one or more features as discussed above, for example at least: a container for containing fluid; a driver for driving the fluid, to cause the fluid to move; the catch being configured such that the fuel droplets are incident on that moving fluid. The catch may be retro-fitted to an existing radiation source, or fitted as an integral part of newly constructed radiation sources.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims that follow.

The invention claimed is:

1. A radiation source comprising:
   a nozzle configured to direct a stream of fuel droplets along a trajectory towards a plasma formation location;
   a laser configured to output laser radiation, the laser radiation directed at the fuel droplets at the plasma formation location to generate, in use, a radiation generating plasma; and
   a catch arranged to catch fuel droplets that pass the plasma formation location, the catch comprising:
   a container constructed to contain a fluid; and
   a driver constructed and arranged to drive the fluid, to cause the fluid to move;
   the catch being configured such that, in use, the fuel droplets are incident on an inclined surface of the fluid moved by the driver.

2. The radiation source of claim 1, wherein the catch further comprises an inclined surface, the driver being arranged to drive fluid along, over or past the inclined surface, the catch being arranged such that, in use, the fuel droplets are incident on fluid that is driven along, over or past the inclined surface.

3. The radiation source of claim 2, wherein fluid that is driven along, over or past the inclined surface is inclined with respect to a trajectory of the droplets.

4. The radiation source of claim 3, wherein the surface is inclined relative to the trajectory of the droplets, and the driver is configured to at least assist in driving fluid down and along the inclined surface to form a film of fluid on that surface, the catch being arranged such that, in use, the fuel droplets are incident on the film of fluid.

5. The radiation source of claim 3, wherein the driver is configured to drive fluid over the inclined surface to form a wave of fluid, the catch being arranged such that, in use, the fuel droplets are incident on the wave of fluid.

6. The radiation source of claim 1, wherein the driver comprises a pump.

7. The radiation source of claim 1, wherein the container is substantially tube-shaped with an opening arranged to receive the droplets.

8. The radiation source of claim 7, wherein the driver is a rotating mechanism constructed to rotate the tube-shaped container.

9. The radiation source of claim 8, wherein the rotating mechanism is constructed to rotate the tube fast enough to ensure that fluid resides on, and/or passes over, an internal inclined surface of the tube-shaped container, the catch being arranged such that, in use, the fuel droplets are incident on fluid that resides on and/or passes over the internal inclined surface of the tube-shaped container.

10. The radiation source of claim 1, wherein the nozzle is configured to direct the stream of fuel droplets along a trajectory that is substantially horizontal, or which is substantially vertical, or in a trajectory that has a horizontal component, or in a trajectory that has a vertical component.

11. The radiation source of claim 1, wherein the fluid is, or comprises, the same material as that which forms the fuel droplets, or wherein the fluid is a carrier for the fuel.

12. The radiation source of claim 1, wherein the catch comprises, or is thermally connectable to, a heater, the heater being configured to heat the fluid, and/or caught droplets, to maintain the fluid, and/or caught droplets, in a fluid form.

13. The radiation source of claim 1, wherein the catch is in fluid connection with the nozzle, such that caught droplets may be directed to and back through the nozzle.

14. A lithographic apparatus comprising:
an illumination system constructed to provide a radiation beam;
a patterning device constructed to impart the radiation beam with a pattern in its cross-section;
a substrate holder constructed and arranged to hold a substrate;
a projection system constructed and arranged to project the patterned radiation beam onto a target portion of the substrate, and
wherein the lithographic apparatus further comprises, or is in connection with, a radiation source comprising
a nozzle configured to direct a stream of fuel droplets along a trajectory towards a plasma formation location;
a laser configured to output laser radiation, the laser radiation directed at the fuel droplets at the plasma formation location to generate, in use, a radiation generating plasma; and
a catch arranged to catch fuel droplets that pass the plasma formation location, the catch comprising
a container constructed to contain a fluid; and
a driver constructed and arranged to drive the fluid, to cause the fluid to move;
the catch being configured such that, in use, the fuel droplets are incident on an inclined surface of the fluid moved by the driver.

15. A method of catching fuel droplets used in a radiation source, the radiation source comprising:
a nozzle configured to direct a stream of fuel droplets along a trajectory towards a plasma formation location;
a laser configured to output laser radiation, the laser radiation directed at the fuel droplets at the plasma formation location to generate, in use, a radiation generating plasma; and
the method comprising:
driving a fluid to cause movement in the fluid; and
directing the fuel droplets toward an inclined surface of the fluid moved by the driver.

* * * * *